United States Patent [19]

Marino

[11] 4,338,550
[45] Jul. 6, 1982

[54] CIRCUIT FOR OBTAINING SAW-TOOTH CURRENT IN A COIL

[75] Inventor: Francesco Marino, Caserta, Italy

[73] Assignee: Indesit Industria Elettrodomestici Italiana, S.p.A., Italy

[21] Appl. No.: 89,582

[22] Filed: Oct. 29, 1979

[30] Foreign Application Priority Data

Oct. 30, 1978 [IT] Italy .............................. 69486 A/78

[51] Int. Cl.³ .............................................. H01J 29/70
[52] U.S. Cl. .................................................. 315/408
[58] Field of Search ........................................ 315/408

[56] References Cited

U.S. PATENT DOCUMENTS

| 3,906,307 | 9/1975 | Van Hattum | 315/408 |
| 4,163,179 | 7/1979 | Farina et al. | 315/408 |
| 4,169,989 | 10/1979 | Zappala | 315/408 |
| 4,200,824 | 4/1980 | Farina et al. | 315/408 |
| 4,223,367 | 9/1980 | Zappala | 315/408 X |
| 4,247,805 | 1/1981 | Zappala | 315/408 |

FOREIGN PATENT DOCUMENTS 1908276 9/1969 Fed. Rep. of Germany .
1254205 11/1971 United Kingdom .

Primary Examiner—Malcolm F. Hubler
Attorney, Agent, or Firm—Ostrolenk, Faber, Gerb & Soffen

[57] ABSTRACT

A line output stage for providing a saw-tooth current in a deflection coil contains a switching circuit between the terminals of the supply source and the terminals of the deflection circuit. The switching circuit acts to reduce the voltage at terminals during the part of the cycle when the transistor is conducting, and so as to increase the voltage during the part of the cycle when the transistor is not conducting. As a result, the voltage at the terminals of the trace capacitor is reduced.

6 Claims, 3 Drawing Figures

CIRCUIT FOR OBTAINING SAW-TOOTH CURRENT IN A COIL

BACKGROUND OF THE INVENTION

This invention relates to a circuit arrangement for driving a saw-tooth current in a coil, and is particularly applicable to the line output stage for providing a saw-tooth current in the horizontal deflection coils of a color television picture tube.

There is known, for example, from U.S. Pat. No. 4,161,675, a line output stage which comprises a trace capacitor and a retrace capacitor connected to a deflection coil to form a circuit which oscillates freely during the retrace interval, a first diode (termed the dumper diode) connected in parallel with the oscillating circuit to conduct during a first part of the trace interval, a second diode and a controllable semi-conductor switch connected in series with one another in a path parallel to the oscillating circuit. The second diode is conductive during a second part of the trace interval and the controllable switch is made conductive during part of the trace interval. The switch is also connected to a supply source via a first inductor so that during the part of the trace interval in which the switch is conductive energy is stored in the first inductor, at least part of which energy is later transferred via a third diode to the oscillating circuit during the period in which the switch is not conducting.

The self-stabilizing deflection circuit in a television set, usually referred to as a Wessel circuit, is a known circuit of the above type. An essentially similar circuit, known as a "POPSY" or a "Power Package System" has recently been proposed by the Philips company for stabilizing the supply of color television sets and generating high voltages for the picture tube.

By means of such a circuit, a deflection circuit on a television set can be supplied with a stabilized voltage lower than that available using normal power mains voltage rectifying circuits. However, the stabilized voltage obtained has a lower limit of about 150-160 V in the case of a mains supply of 220 V a.c. This figure takes into account the need to allow for a 10% increase and is higher for a mains supply of greater than 220 V a.c.

Accordingly, it is an object of the present invention to provide a circuit which allows the stabilized voltage to be reduced below the levels currently obtainable using known circuits.

SUMMARY OF THE INVENTION

A circuit arrangement for driving a saw-tooth current in a coil constructed in accordance with the present invention is disclosed a trace capacitor and a retrace capacitor are connected to the coil to form an oscillating circuit which oscillates freely during the retrace interval. A first diode is connected in parallel with the oscillating circuit to conduct current during the first part of the trace interval. A controllable semi-conductor switch and a second diode are connected in series with one another in a path parallel to the said oscillating circuit, the second diode being conductive during a second part of the trace interval and the switch being conductive during part of the trace interval. A supply source and an inductor connecting the switch to the supply source so that during the part of the trace interval in which the switch is conductive, energy is stored in the inductor. A part of the stored energy is subsequently transferred, during the period in which the switch is not conducting, to the oscillating circuit via a third diode. The supply source is provided with means for periodically varying the supply voltage in a predetermined phase relationship with the conducting state of the switch, thereby to reduce the voltage across the trace capacitor.

BRIEF DESCRIPTION OF THE DRAWINGS

The invention will now be particularly described, by way of example, with reference to the accompanying drawings, in which.

DETAILED DESCRIPTION OF THE DRAWINGS

Figure 1:
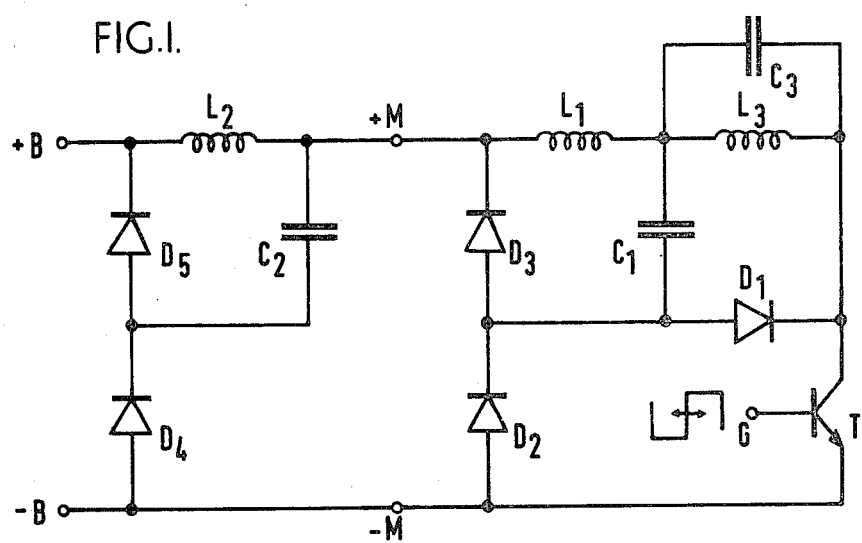
FIG. 1 shows a first circuit arrangement according to the present invention.

In FIG. 1, $+B$ and $-B$ are the two terminals of a d.c. supply voltage source such as that obtainable by rectifying and filtering an a.c. mains voltage supply.

The letter T indicates a final line transistor of a television set (e.g. Philips BU 208) with a control electrode, G, which receives a variable duty cycle, rectangular-wave control signal (shown schematically in the diagram) for regulating deflection voltage. This control signal is obtained using conventional circuitry (not shown in the diagram) designed for generating a signal synchronized with the line sync pulses of the received television signal and having a duty cycle which varies according to the deflection voltage it is desired to produce. Examples of these circuits can be found in current technical literature and any engineer skilled in this field will be familiar with them.

$L_3$ is a line deflection coil, $C_3$ is a retrace capacitor which determines the length of the retrace interval. $C_1$ is a trace capacitor having a much higher capacity than $C_3$. $D_1$ is a dumper diode, that is, a diode which conducts for the first part of the trace interval when transistor T is non-conductive. $D_2$ is a second diode which conducts during the second part of the trace interval when transistor T is also conductive. $L_1$ is a first supply inductor with a much higher rating than deflection coil $L_3$. $D_3$ is a third diode which conducts when $D_2$ is non-conductive, that is, during the retrace interval and the first part of the trace interval.

The circuit described up to now corresponds essentially to part of the Philips "POPSY" circuit mentioned above and is connected to two supply terminals marked $+M$ and $-M$.

The current in the supply inductor $L_1$ increases at a substantially constant rate during the second part of the trace interval when the transistor T is conductive, but decreases, also at a substantially constant rate, during the remainder of the cycle. The voltage across the terminals of the trace capacitor $C_1$ is substantially constant and lower than the voltage across terminals $+M$ and $-M$.

However, since the diode $D_2$ and the transistor T are non-conductive during both the retrace interval and the first part of the trace interval, the voltage across terminals $+M$ and $-M$ is only of importance to the circuit to the right of the terminals $+M$ and $-M$ in FIG. 1 during the second part of the trace interval. Thus the voltage supply at terminals $+M$ and $-M$ may be varied to supply a lower voltage during the second part of the trace interval, so as to reduce the voltage at the terminals of the trace capacitor.

In FIG. 1, this is accomplished by providing the supply source with a further circuit which is self-switching in a predetermined phase relationship with the conducting state of the transistor T. The circuit comprises a second inductor $L_2$ connected in series with the supply inductor $L_1$, a second capacitor $C_2$ having substantially the same capacity as capacitor $C_1$, and two further diodes $D_4$ and $D_5$ connected with the capacitor $C_2$ and inductor $L_2$. Diodes $D_4$ and $D_5$ are connected in series with one another, and inductor $L_2$ and capacitor $C_2$ are serially connected to form a current path parallel to diode $D_5$. During the second part of the trace interval, the current in $L_2$ increases so as to make diode $D_4$ conductive. During the remainder of the cycle, diode $D_4$ is non-conductive while $D_5$ is conductive, and there is an accompanying fall in current in $L_2$. As a result of the additional circuit, the average voltage at terminals $+M$ and $-M$ is equal to that at terminals $+B$ and $-B$, but the voltage at terminals $+M$ and $-M$ is reduced during the second part of the trace interval and raised during the remainder of the cycle, when it does not affect the voltage across the terminals of capacitor $C_1$.

Figure 2:
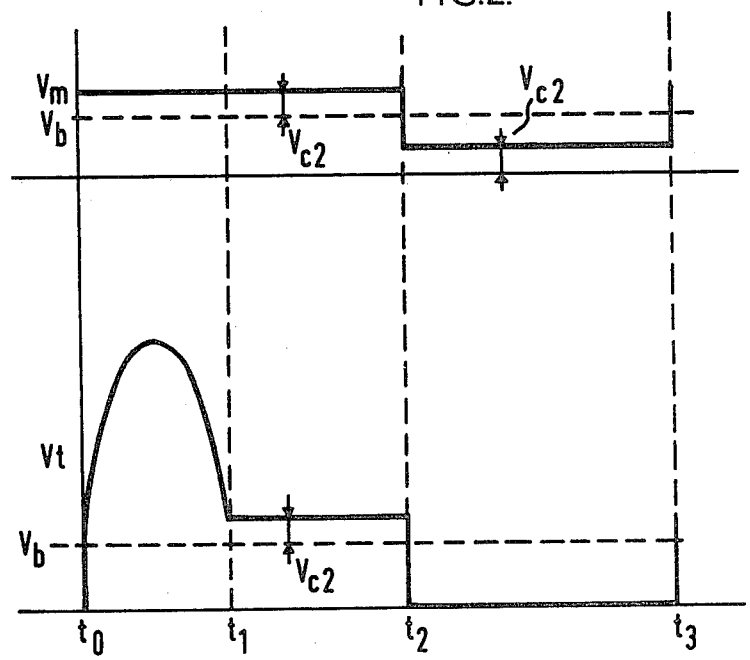
FIG. 2 shows characteristic voltage graphs related to the circuit of FIG. 1.

FIG. 2 shows graphs of voltage (Vt) at the terminals of transistor T (collector-emitter voltage); the graph is semi-sinusoidal during the retrace interval, constant $(V_b + V_{c2})$ during the first part of the trace interval and again constant and substantially zero during the second part of the trace interval. Voltage $V_m$, the voltage across terminals $+M$ and $-M$, equals $V_b + V_{c2}$ during the retrace interval and the first part of the trace interval and $V_b - V_{c2}$ during the second part of the trace interval.

Consequently, for a given supply voltage $V_b$ and conduction time $t_2 - t_3$ of the transistor, the deflection voltage (at the terminals of $C_1$) in the FIG. 1 circuit is lower than in known circuits. This means that stabilized voltages of about 80 V can be obtained starting from a mains supply voltage of 220 V.

Figure 3:
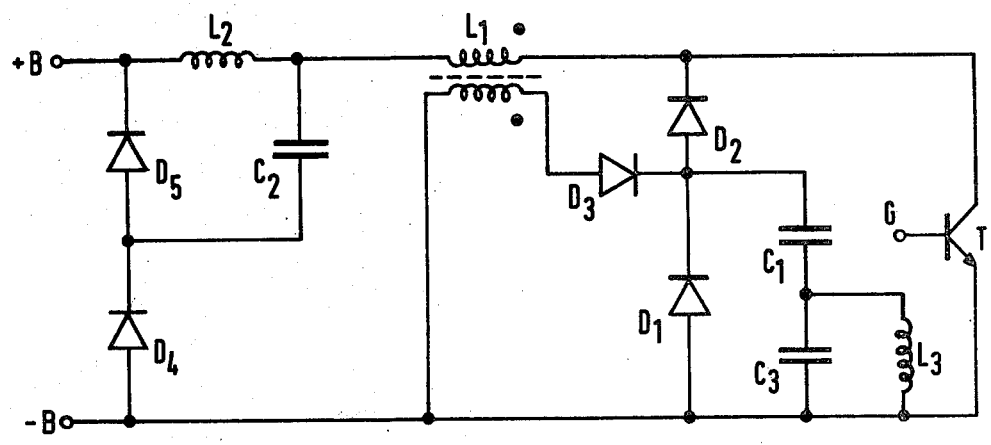
FIG. 3 shows a second circuit arrangement according to the present invention.

FIG. 3 shows a second circuit arrangement suitable for producing the same result as the circuit of FIG. 1. In FIG. 3, components corresponding to those shown in FIG. 1 are arranged differently, but bear the same reference characters.

In the circuit of FIG. 3, the inductor $L_1$ is the primary of a transformer, the secondary of which is connected to diode $D_3$. In this way, the deflection coil is directly connected to the negative pole of the supply source and has no d.c. current flowing through it. The FIG. 3 circuit can be considered as the known Wessel circuit with the addition of parts $D_4$, $D_5$, $C_2$ and $L_2$. Deflection voltage is reduced owing to the fact that, when transistor T is conductive, diode $D_4$ is also conductive and the circuit is supplied by the voltage at the terminals of $C_2$.

The advantages of the present invention will be clear from the description given. To those skilled in the art, it will be clear that a number of variations can be made to the circuits described without, however, departing from the scope of the present invention.

I claim:

1. A circuit arrangement for driving a saw-tooth current in a coil, comprising: an oscillating circuit including a deflection coil; a trace capacitor and a retrace capacitor, said deflector coil being connected to said trace and retrace capacitors such that said oscillating circuit oscillates freely during the retrace interval; a first diode connected in parallel with the said oscillating circuit and adapted to conduct current during the first part of the trace interval; a controllable semi-conductor switch and a second diode connected in series with one another in a path parallel to said oscillating circuit, said second diode being conductive during a second part of the trace interval and said switch being conductive during part of the trace interval; a third diode; a supply source and an inductor connecting said switch to said supply source so that during that part of the trace interval in which the switch is conductive, energy is stored in the inductor, and such that a part of said energy stored in said inductor is subsequently transferred, during the period in which the switch is not conducting, to the said oscillating circuit via said third diode; said inductor producing a reduction of the voltage across said trace capacitor; means located between said supply source and said inductor for periodically varying, at a frequency substantially equal to that of said saw-tooth current, the voltage supplied to said inductor in a predetermined phase relationship with the conducting rate of said switch, so as to produce a further reduction of the voltage across the trace capacitor.

2. A circuit arrangement as claimed in claim 1, wherein said means for varying the voltage supplied to said inductor comprises a switching circuit connected in series to the flow of energy and responsive to said transistor being conductive to supply voltage additional to the voltage from said supply source.

3. A circuit arrangement as claimed in claim 2, wherein the switching circuit includes a second inductor through which at least part of the supply current passes, an additional capacitor which is charged with a lower voltage than the supply source and two further diodes, one of which conducts during the part of the cycle in which the supply current is rising and the other of which conducts during the remainder of the cycle.

4. The circuit arrangement of claim 1, in which said means for periodically varying the voltage supplied to said inductor comprises a second inductor connected in series between said inductor and a terminal of said supply, two series connected diodes connected across said supply, the cathode of a first of said diodes connected to a positive supply terminal of said supply and the anode of a second of said diodes connected to a negative supply terminal of said supply, the anode of said first diode and the cathode of said second diode being connected to a first lead of an additional capacitor, a second lead of said additional capacitor being connected to said inductor.

5. The circuit arrangement of claim 3 or claim 4, in which said additional capacitor has substantially the same capacity of said trace capacitor.

6. The circuit of any one of claims 1 through 4, in which said means located between said source and said inductor varies the voltage applied to said inductor so that its average value is equal to that of the supply voltage, but is reduced during the second part of the trace interval, and raised during the remainder of the cycle, said rise in voltage thereby not affecting the voltage across said trace capacitor.

* * * * *